United States Patent
Kobayashi

(12) 
(10) Patent No.: US 6,342,815 B1
(45) Date of Patent: Jan. 29, 2002

(54) MANUFACTURABLE HBT POWER DISTRIBUTED AMPLIFIER FOR WIDEBAND TELECOMMUNICATIONS

(75) Inventor: Kevin W. Kobayashi, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/678,138

(22) Filed: Oct. 4, 2000

(51) Int. Cl.[7] ............................................... H03F 3/60
(52) U.S. Cl. .......................... 330/286; 330/54; 330/295
(58) Field of Search ................... 330/286, 294, 330/295, 54

(56) References Cited

U.S. PATENT DOCUMENTS

| | | | | |
|---|---|---|---|---|
| 4,543,535 A | * | 9/1985 | Ayasli | 330/286 |
| 5,028,879 A | * | 7/1991 | Kim | 330/286 |
| 5,227,734 A | * | 7/1993 | Schindler et al. | 330/286 |
| 5,367,267 A | * | 11/1994 | Fuchs | 330/286 |
| 6,049,250 A | * | 4/2000 | Kintis et al. | 330/286 |

OTHER PUBLICATIONS

Viaud, J.P. et al., "First Demonstration of a 0.5W, 2 to 8 GHz MMIC HBT Distributed Power Amplifier Based on a Large Signal Design Approach", IEEE MTT–S Digest, Jun. 1997, pp. 893–896.

Ayasli, Y. et al., "Capacitively Coupled Traveling–Wave Power Amplifier", IEEE Transactions on Microwave Theory and Techniques, Dec. 1984, vol. 32, No. 12, pp. 1704–1709.

* cited by examiner

*Primary Examiner*—Robert Pascal
*Assistant Examiner*—Khanh Van Nguyen
(74) *Attorney, Agent, or Firm*—Harness, Dickey & Pierce, P.L.C.

(57) ABSTRACT

A power distributed amplifier that provides a high power output and a wide bandwidth. The amplifier includes an input and output load termination resistors opposite respective input and output ends of a transmission line. A plurality of amplifying devices are distributed along and electrically connected to the input and output transmission lines. An active feedback loop is connected between the output load termination resistor and the input load termination resistor. The feedback loop includes a regulator connected across the output load resistor and a low pass filter connected between the regulator and the input load termination resistor. The regulator senses voltage across the output load termination resistor and provides a regulated signal to the amplifying devices to control their output currents. The regulator and the line filter combine to provide a reduction in DC bias current sensitivity, RF gain and output power sensitivity over wide process variations.

22 Claims, 6 Drawing Sheets

MANUFACTURABLE HBT POWER DISTRIBUTED AMPLIFIER FOR WIDEBAND TELECOMMUNICATIONS

BACKGROUND OF THE INVENTION

1. Field of the Invention

This invention relates generally to a wideband power amplifier and, more particularly, to a capacitively coupled, wideband MMIC power amplifier that employs an active feedback regulator to provide reduced DC and RF process variation dependence to make the amplifier more easily and readily manufacturable.

2. Discussion of the Related Art

Wideband MMIC power amplifiers are widely employed in the telecommunications industry. An MMIC amplifier which can deliver high power and produce large voltage swings over a wide frequency bandwidth is important for many telecommunication applications, such as high data rate fiber transmission systems, microwave frequency converter applications, etc. For example, there exists a need in the art for a low-cost, wide bandwidth MMIC amplifier that can deliver medium to high power (>12 dBm) at an output voltage greater than 2 volts peak-to-peak over several decades of frequency bandwidth (20 kHz–20 GHz). However, making a semiconductor amplifier that is both wideband and high power is difficult because of certain manufacturing limitations, particularly the limitations of DC and RF process variation dependence.

Various circuit designs have been proposed in the art to make wide bandwidth, high power semiconductor amplifiers. For example, a capacitively coupled distributed amplifier has been proposed that is one of the best known designs for achieving this goal. In one particular known MESFET MMIC design, a series capacitance is employed in connection with the gate of each FET to reduce the effective shunt capacitance used to synthesize the input transmission line of the distributed amplifier to enable a greater distributed amplifier bandwidth without scaling down the size of the power FETs used. It has been shown that this approach could achieve 1 W of output power over a 2–8 GHz bandwidth. This circuit design has been extended to a capacitively coupled HBT distributed amplifier to improve the power added efficiency (PAE) and linearity of the wideband power amplifier. In this modified design, 0.5 W was obtained over a 2–8 GHz bandwidth. In both of the designs, the lower frequency band edge is limited to 2 GHz due to the capacitive coupling technique, thus, preventing them from being used in some telecommunications applications requiring a lower frequency band.

FIG. 1 is a schematic diagram of a conventional capacitively coupled power distributed amplifier 10 that is known in the art. The amplifier 10 includes an input transmission line 12 and an output transmission line 14, where input inductors 16 are periodically connected in series along the input transmission line 12 and output inductors 18 are periodically connected in series along the output transmission line 14. The input line 12 and the output line 14 can be traces on a printed circuit board. An input signal, such as a microwave signal, applied to an input node 20 of the input transmission line 12 is electrically coupled into the output transmission line 14, and is provided at an output node 22 of the output transmission line 14. An input termination resistor 26 is provided at an opposite end of the transmission line 12 from the node 20 to prevent back reflections on the transmission line 12 that may act to reduce the input signal depending on the relative phase of the reflection. Likewise, an output termination resistor 28 is provided at an end of the output transmission line 14 opposite to the node 22 to prevent back reflections of the output signal on the transmission line 14.

The amplifier 10 includes a plurality of amplifier stages 32 that are distributed between the inductors 16 and 18 along the transmission lines 12 and 14, and act to couple electromagnetic energy from the input transmission line 12 to the output transmission line 14 with a certain amount of gain. Each amplifier stage 32 includes an amplifying device 34 that may be an HBT transistor. The amplifier 10 defines a distributed transmission line modeled by the series inductors 16 and 18 and a shunt capacitance $C_\pi$ in the amplifying devices 34. The bandwidth of the signal being coupled from the input transmission line to the output transmission line 14 is determined by the inductance of the inductors 16 and 18 and the shunt capacitance $C_\pi$. Although the inductors 18 and the output shunt capacitance of the amplifying devices 34 affects the output power on the output transmission line 14, it is typically the input shunt capacitance $C_\pi$ of the amplifying devices 34 that affects the overall gain-bandwidth product. Therefore, the practical upper frequency bandwidth limit of the distributed amplifier 10 is usually determined by the cut-off frequency $f_{ci}$ of the input distributed transmission line 12.

The cut-off frequency $f_{ci}$ is defined as:

$$f_{ci} = 1/(\pi L_T C_T) \tag{1}$$

where $L_T$ is the inductance of the inductors 16 and $C_T$ is the effective shunt capacitance of the amplifier stages 32. To increase the gain and output power of the amplifier 10, it is necessary to increase the size of the amplifying devices 34, or increase the bias current applied to the transistor in the devices 34. However, when the amplifying devices 34 are biased with more current, a higher input diffusion capacitance is created in the amplifying devices 34. This diffusion capacitance causes the amplifying devices 34 to appear to have a large shunt capacitance $C_\pi$, which acts to reduce the cut-off frequency as defined in equation (1). So, as the power output of the amplifier 10 increases, the bandwidth typically decreases.

To overcome this upper bandwidth limitation, it is known in the art to employ a series capacitor 36 in combination with each amplifying device 34 in each stage 32. The series capacitor 36 acts as a division of the shunt capacitance $C_\pi$ in the amplifying devices 34 that reduces the input capacitance. Because the capacitor 36 is in series with the shunt capacitance $C_\pi$ in the amplifying devices 34, the effective capacitance of the transconductance of the amplifier 10 can be reduced, thus increasing the upper bandwidth limitation for high transition bias currents. This allows a designer to develop a distributed amplifier with a greater upper bandwidth cut-off frequency. In this design, the effective shunt capacitance $C_T$ is $C_{bb} C_\pi/(C_{bb}+C_\pi)$, where $C_{bb}$ is the capacitance of the capacitor 36. It is desirable to have a low value for $C_{bb}$ to produce a small $C_T$ which allows a greater bandwidth without changing the output characteristics of the amplifier 10. Thus, a wider bandwidth can be achieved without sacrificing power.

Because the capacitor 36 has an infinite or high impedance at DC or low frequencies, the low end of the frequency bandwidth is limited. To overcome this limitation, it is known to include a shunt resistor 38 in parallel with the capacitor 36 to provide a signal path around the capacitor 36 for low frequency or DC signals. The low frequency performance of the amplifier 10 is determined by:

$$f = 1/2\pi R_{bb} C_{bb} \qquad (2)$$

where $R_{bb}$ is the value of the resistor 38. It is thus desirable to provide a high resistance for the resistor 38 to get a low frequency response at the lower end of the bandwidth. The lower frequency band edge is approximately determined by the pole produced by the capacitor 36 and the resistor 38. The resistor 38 allows a bias to the base or gate terminal of the amplifying devices 34. As will be shown below, a large value for the resistor 38 causes the manufactured amplifier to be more sensitive for variations in process.

A benefit of the capacitive coupling technique as discussed above is that the upper frequency bandwidth can be extended for a given output power, or, for a greater bandwidth, the device periphery can be increased to be obtain higher output power. The net gain is an increase in power bandwidth. However, this increase in power bandwidth is at the expense of gain because of the capacitive voltage division at the input of the amplifier 10, and the lower frequency response. Because the capacitor 36 is usually chosen to be quite small in order to raise the upper frequency band edge, the resistor 38 must be large (>1 kΩ) in order to extend the lower frequency response. For a typical value of the resistor 38 of 400Ω the lower frequency band edge is around 2 GHz for a practical HBT based design. This is unacceptable for use in wideband fiber telecommunications which requires a low end frequency response to be around 20 kHz and advanced broadband RF switch applications with similar low frequency requirements.

FIG. 2 shows the effect of the resistor 38 on the low frequency response of a GaAs HBT capacitively coupled distributed amplifier, such as the amplifier 10. This graph shows that a large value for the resistor 38 of 10 kΩ is required to achieve a flat gain response down to 20 kHz. Thus, a large value for the resistor 38 in the Kilo-ohms range is required in order to extend the practical low frequency response for such applications. However, due to the finite base currents of the HBT devices, which can vary by a factor of 5–10 due to the HBT DC beta process variation in a high volume production line, a large value for the resistor 38 can induce large bias variations in the amplifier 10 which consequently results in a large unacceptable RF performance variation of the MMIC product. DC beta is an HBT parameter that is the forward current gain of the HBT and is approximately equal to the collector current divided by the base current of the HBT.

FIG. 3 is a graph with power on the horizontal axis and current on the vertical axis that shows the amplifier bias current sensitivity to the HBT DC beta process variations. This graph shows that 70% variations in total amplifier bias current $I_{ce}$ can result from a typical HBT DC beta variation of 200–1000. The commercial wafer acceptance criteria for DC beta is usually set very low (150), and this is only a minimum DC beta requirement with an unbounded upper range. Because of the complex process dependence, no upper bound restrictions on the DC beta can be imposed. Therefore, it is necessary that the resistor 38 have a high value for the reasons discussed above, but this high value causes problems in the manufacturability of the resistor by making it more sensitive to variations in the manufacturing process.

The resulting impact on amplifier output performance is shown in FIG. 4 which illustrates the output power, gain and power added efficiency (PAE) of the amplifier 10, vs. input power dependence on the DC beta. The large bias sensitivity illustrated in FIG. 3 has resulted in large RF sensitivity of between 2–2.5 dB for gain and output power. This type of variation is unacceptable in commercial telecommunications where large emphasis exists on plug and replace sockets for low cost field maintenance.

What is needed is a technique for increasing the bandwidth and power output for an HBT power distributed amplifier, that has application for fiber optic telecommunications, without sacrificing existing process variations. It is therefore an object of the present invention to provide such an amplifier.

SUMMARY OF THE INVENTION

In accordance with the teachings of the present invention, a capacitively coupled power distributed amplifier is disclosed that provides a high power output and a wide bandwidth necessary for telecommunications applications without being sensitive to process variations. The amplifier includes an input load termination resistor opposite an input end of an input transmission line, and an output load termination resistor opposite an output end of a output transmission line. A series of distributed amplifying devices are connected between the input transmission line and the output transmission line.

An active feedback regulation loop is connected between the output load termination resistor and the input load termination resistor. The feedback loop includes an active feedback regulator connected across the output load resistor, and a lossy, low-pass distributed transmission line filter connected between the regulator and the input load termination resistor. The regulator senses a voltage potential on the output load termination resistor, compares the voltage potential to a reference potential, and provides a regulated output signal to bias the amplifying devices to control their output in a desirable manner. The transmission line filter filters out noise for the long connection between the input load resistor and the output load resistor. The regulator and the distributed transmission line filter combine to provide a reduction in DC bias current sensitivity, RF gain and output power sensitivity over wide process variations for a wide range of DC betas.

The invention as described herein provides a number of novel features over the known capacitively coupled distributed amplifier. These features include using the output load termination resistor as a DC sensor resistor for the regulator; directly connecting the regulator to an RF sensitive node of the amplifiers output transmission line; using an RF blocking resistor for inhibiting the broadband dynamic loading effects of the regulator from the RF sensitive node; using a compensation capacitor on a high impedance node of the regulator to allow a reasonable size monolithic capacitor for filtering out the RF signal introduced into the regulator from the output of the amplifier; and using the lossy, distributed low-pass filter transmission line for creating a controlled broadband feed from the output of the regulator to the input load termination resistor to inhibit in-band resonances caused by the interaction with an off-chip by-pass load network.

Additional objects, features and advantages of the present invention will become apparent from the following description and appended claims, taken in conjunction with the accompanying drawings.

DETAILED DESCRIPTION OF THE PREFERRED EMBODIMENTS

The following discussion of the preferred embodiments directed to an improved capacitively coupled power distributed amplifier is merely exemplary in nature, and is in no way intended to limit the invention or its applications or uses.

Figure 1:
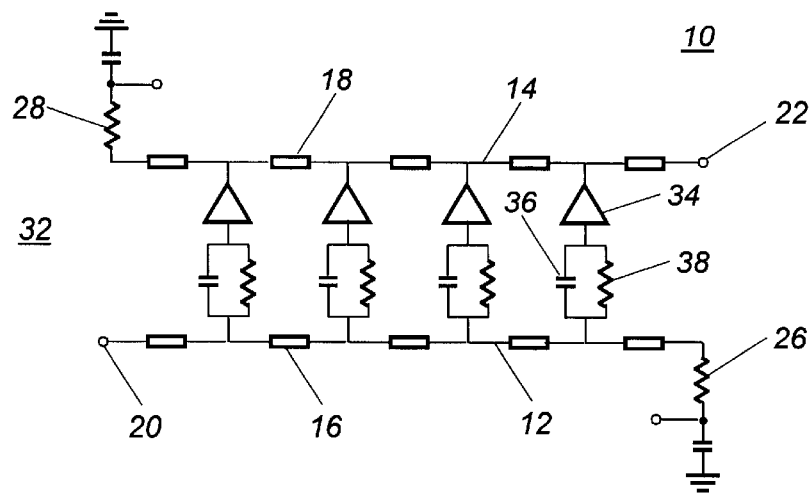
FIG. 1 is a schematic diagram of a known capacitively coupled power distributed amplifier.
Figure 2:
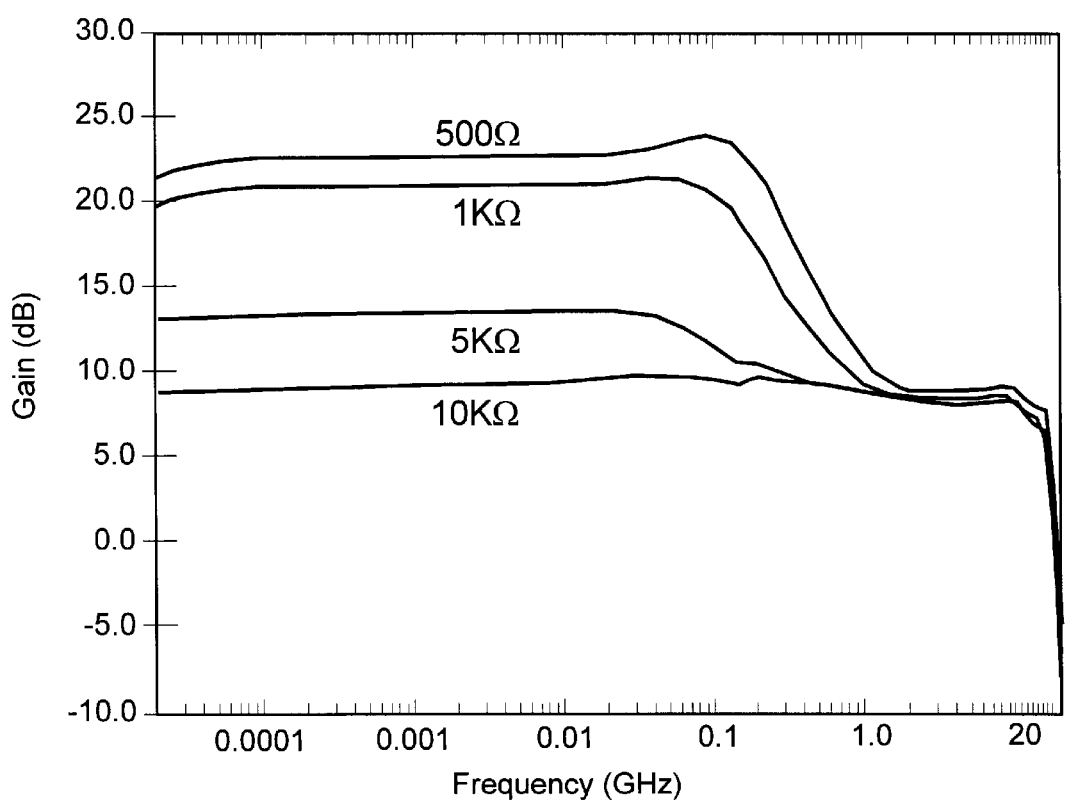
FIG. 2 is a graph with frequency on the horizontal axis and gain on the vertical axis that shows the effect of a shunt resistor on the low frequency response of the amplifier depicted in FIG. 1.
Figure 3:
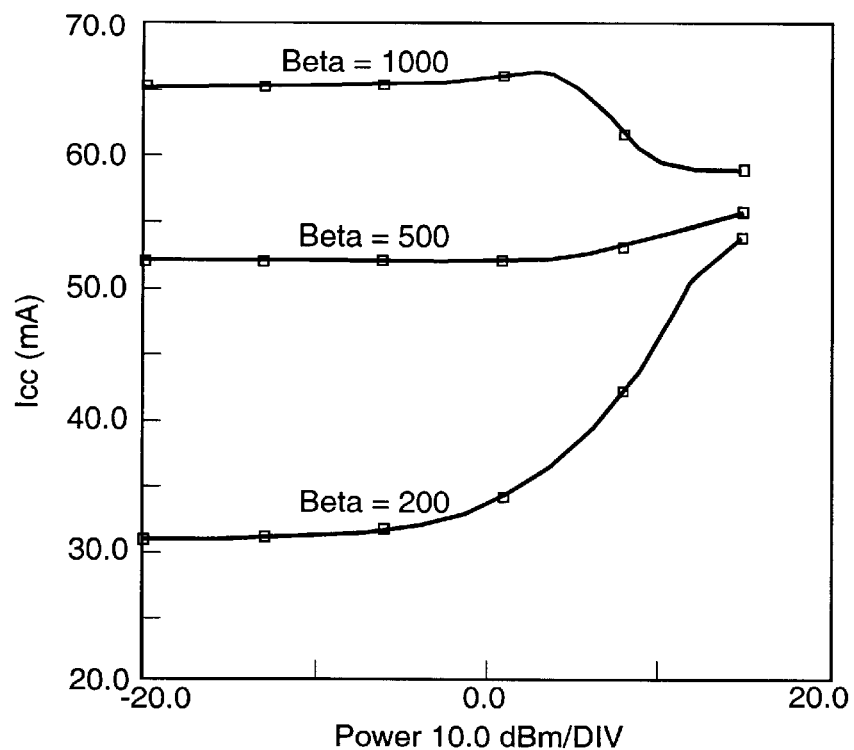
FIG. 3 is a graph with power on the horizontal axis and bias current on the vertical axis that shows bias current sensitivity to the HBT DC beta process variations of the amplifier depicted in FIG. 1.
Figure 4:
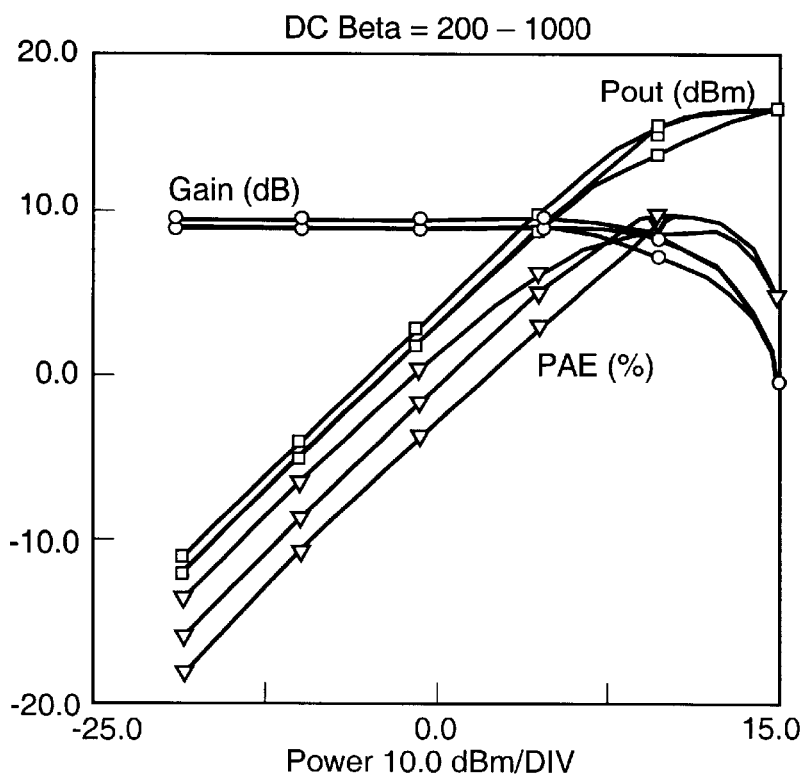
FIG. 4 is a graph showing amplifier output performance that illustrates output power, gain and PAE vs. input power dependence on DC beta for the amplifier depicted in FIG. 1.
Figure 5:
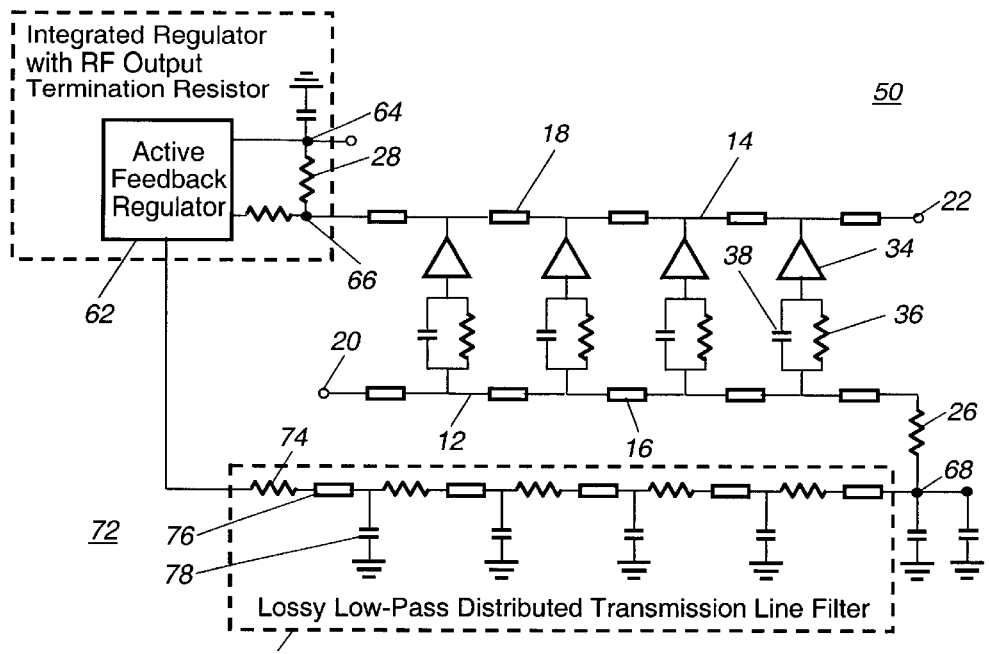
FIG. 5 is a schematic diagram of a capacitively coupled power distributed amplifier, according to an embodiment of the present invention.
Figure 6:
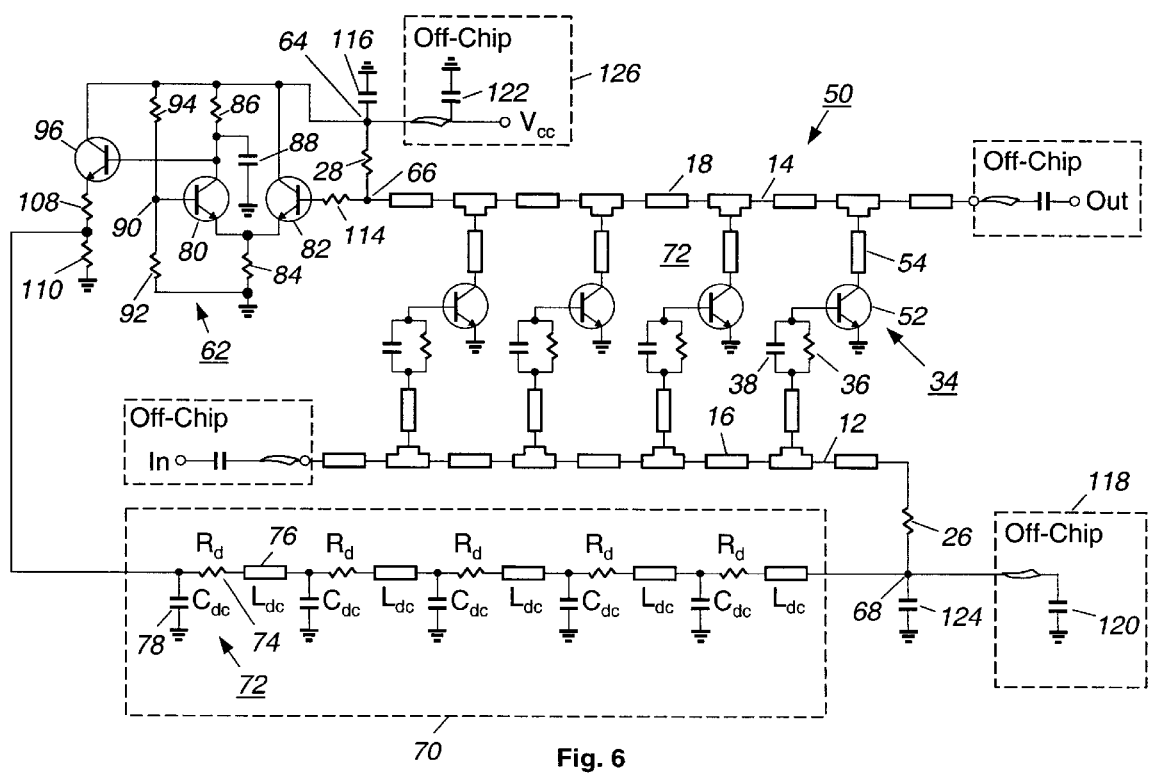
FIG. 6 is a detailed schematic diagram of the capacitively coupled power distributed amplifier shown in FIG. 5.

FIG. 5 is a schematic diagram of a capacitively coupled power distributed amplifier 50 that provides increased bandwidth and power output over the conventional distributed amplifiers known in the art, without being sensitive to manufacturing and process variations. FIG. 6 is a detailed schematic diagram of the amplifier 50. The amplifier 50 is a variation of the known amplifier 10 shown in FIG. 1, and therefore, like components between the amplifiers 10 and 50 are labeled the same and operate in the same manner. In this embodiment, the amplifying devices 34 include an HBT 52 and inductors 54.

The value of the resistor 38 and the capacitor 36 are selected to achieve a very broad multi-decade bandwidth from 20 kH to 20 GHz consistent with the discussion above. Therefore, the wideband distributed amplifier response is extremely susceptible to in-band resonance loading on either the output load termination resistor 28 or the input load termination resistor 26. Unlike DC bias regulation for narrow band amplifiers, monolithic regulation or active feedback implementations with broadband amplifiers must address these in-band resonance issues, and although the fundamental schematics are straight forward, it is imperative that these practical issues be addressed in the design to ensure a readily manufacturable product.

To address these concerns, the amplifier 50 includes an active feedback regulation loop employed between the output load termination resistor 28 and the input load termination resistor 26. The feedback loop comprises an active feedback regulator 62 having an input connected at nodes 64 and 66 on opposite sides of the resistor 28, and a lossy low-pass distributed transmission line filter 70 connected between the regulator 62 and the input load termination resistor 26. The regulator 62 senses the voltage potentional across the resistor 28, and then provides a controlled output potential to the resistor 26 at node 68 that biases the base terminals of the HBTs 52 to cause the output current of the transistors 52 to change to provide the desirable output potential across the resistor 28. The transmission line filter 70 filters the RF signal applied to the regulator 62 from the output transmission line 14, and provides a controlled impedance between the long feedback path from the regulator 62 to the resistor 26. The feedback loop is a negative feedback loop in that reducing the output of the regulator 62 increases the gain of the transistor 52.

The regulator 62 includes differential amplifier transistors 80 and 82, a current source resistor 84, a DC load resistor 86, a compensation capacitor 88, and resistors 92 and 94 providing a reference voltage at node 90. The regulator 62 compares the voltage potential at the node 66 with the reference voltage at the node 90. The differential amplifier transistors 80 and 82 act as a comparator amplifier for this purpose. The difference in the voltage potential between the reference voltage and the voltage at the node 66 is applied to an emitter follower transistor 96. The emitter follower transistor 96 drives the bias current of the transistors 52 in the amplifying devices 34. Resistors 108 and 110 are used to DC lever shift the regulator output voltage for proper distributed amplifier base voltage biasing. The load resistor 86 sets the gain of the regulator 62 and controls, in part, the bias regulation performance. The capacitor 88 is a compensation capacitor as well as a low-pass filter used to filter out the high frequency RF signals introduced into the regulator 62 by the output transmission line 14.

The active feedback regulator 62 uses the RF load termination resistor 28 as a DC sensor resistor. The reference voltage at the node 90 is mirrored to the node 66 through an RF blocking resistor 114 at the base of the transistor 82. The regulated voltage drop across the resistor 28 produces a regulated bias current for the amplifier 50. The effective broadband impedance that loads down the node 66 affects the broadband response of the amplifier 50. The blocking resistor 114 reduces the impact of the dynamic load presented by the regulator 62 looking into the transistor 82. The dynamic impedance would otherwise cause undesirable ripples in the broadband response of the output distributed transmission line 14. In the conventional distributed amplifier, the node 66 is typically and ideally loaded down only by the termination resistor 28 and a bypass capacitor 116. Further, in the conventional distributed amplifier, a DC voltage bias is applied at the node 64 which is more impervious to impedance loading than the node 66. An off-chip network 126, including a by-pass capacitor 122, is connected to the node 64 for providing an off-chip connection to an input voltage potential $V_{cc}$.

Because of the finite physical length between the output load termination resistor 28 and the input load termination resistor 26, whose distance is fundamentally derived from the inherent design topology, a long wiring trace that spans this distance is required to complete the regulator loop between the output of active regulator emitter follower transistor 96 and the input load termination resistor 26. However, a long uncontrolled transmission line trace connecting the active regulator 62 to the node 68 at the input transmission line termination resistor 26 can cause in-band resonances which severely impair the broadband gain flatness response of the amplifier 50. Therefore, the lossy, low-pass distributed transmission line filter 70 is employed because it has a controlled impedance and loss characteristics that exhibit an in-band resonance created by its long interaction with the effective broadband RF load impedance at the node 68.

The transmission line filter 70 includes a plurality of stages 72 comprising RCL filtering components including a resistor 74, an inductor 76 and a capacitor 78. The impedance and cut-off frequency of the filter 70 can be tailored to inhibit potential in-band resonance due to interaction with an off-chip bypass network 118 including a by-pass capacitor 120. The resistors 74 also further inhibit high Q resonances resulting from the complex on-chip/off-chip load at the node 68. The off-chip by-pass capacitors 120 and 122 for the input and output load termination resistors 26 and 28, as well as the AC-blocking capacitors 124 and 116 for the input and output, are also provided in the amplifier 50, and can also determine the low frequency response limit of the amplifier 50. However, because the capacitors 116 and 124 are directly accessible to the off-chip by-pass networks 126 and 118, they will not be the limiting factor in determining the low frequency response of the amplifier 50.

By the invention, increases in the HBT capacitively coupled distributed amplifiers tolerance to process variations in the DC beta of the HBTs enables the use of a large value for the resistors 38, and can provide practical low-end frequency performance down to 20 kHz. In particular, this invention can result in a seven times reduction in the DC bias current sensitivity to process variation for a wide range of DC beta (200–1000). Moreover, this invention reduces the RF gain and output power sensitivity from 2–2.5 dB down to 0.2 dB over a wide processed variation in DC beta.

Some of the unique features of the distributed amplifier 50 include using the output load termination resistor 28 as a DC sensor resistor for the regulator 62; directly connecting the regulator 62 to the RF sensitive node 66 of the amplifiers output transmission line (this node is typically not used for DA biasing due to high sensitivity to RF loading); using the RF blocking resistor 114 for inhibiting the broadband dynamic loading effects of the regulator 62 from the RF sensitive node 66 of the amplifier 50; using the compensation capacitor 88 on a high impedance node of the regulator 62 for filtering out the RF signal introduced into the regulator 62 from the output of the amplifier 50; and using the lossy distributed low-pass filter transmission line 70 to create a controlled broadband feed from the output of the regulator 62 to the input load termination resistor 26 to inhibit in-band resonances caused by the interaction with the off-chip by-pass network 118.

These advantages can be realized by comparing the following graph with the like graphs for the amplifier 10.

Figure 7:
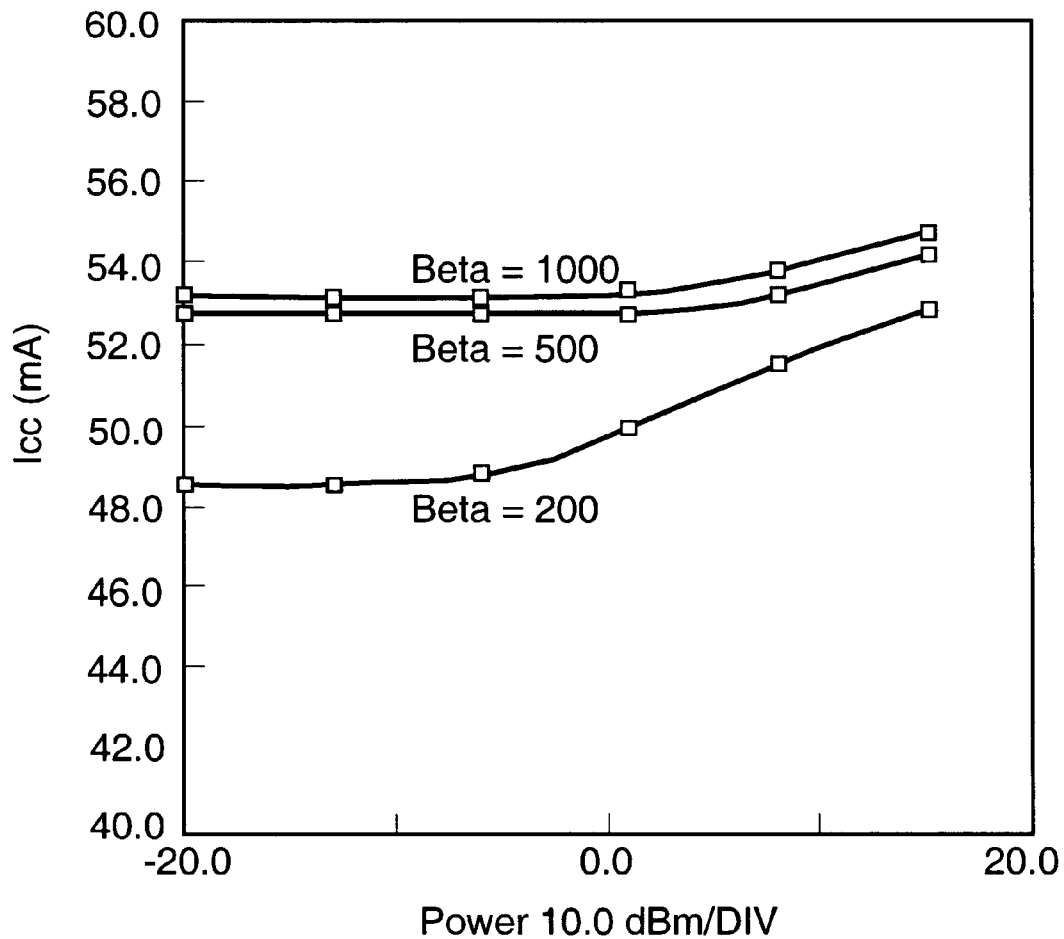
FIG. 7 is a graph with power on the horizontal axis and bias current on the vertical axis that shows the effect of DC beta variation on the DC bias current of the amplifier depicted in FIG. 6.

FIG. 7 shows the affect of DC beta variation on the DC bias current of the amplifier 50, and illustrates that less than a ten percent bias current variation is achieved with the amplifier 50 making it seven times less sensitive and more manufacturable than the amplifier 10.

Figure 8:
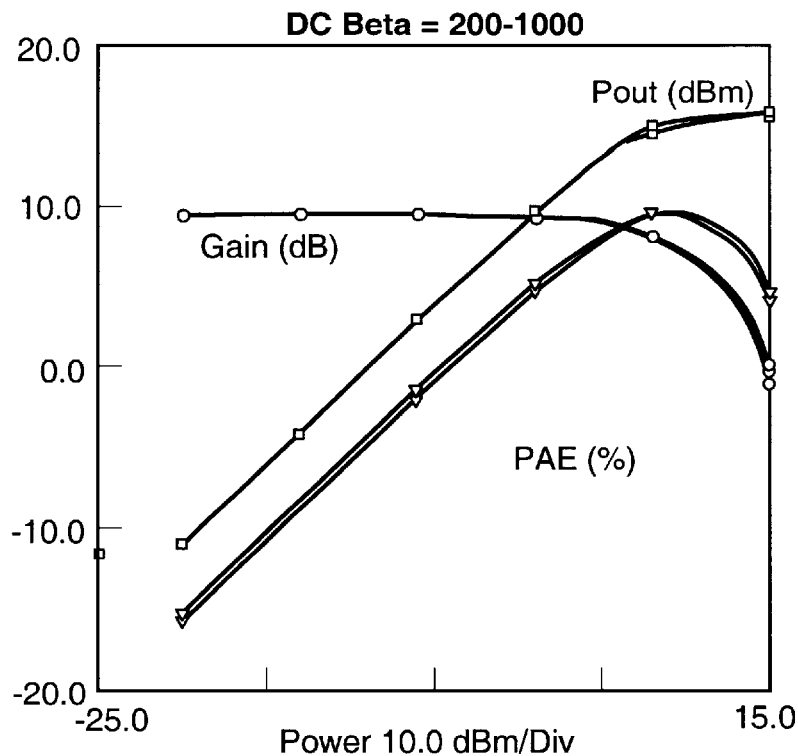
FIG. 8 is a graph that shows the effect of DC beta variation on the output performance of the amplifier depicted in FIG. 6.

FIG. 8 shows the effect of the DC beta variation on the output performance of the amplifier 50, and illustrates that the gain in power variation can be controlled to within 0.2 dB over a wide process range of DC beta (200–1000). As a result, the output performance is improved from a 2–2.5 dB variation in output power to only a fraction of a dB. Thus, a significant recovery in RF wafer and module yield can be obtained by applying the features of the present invention.

Figure 9:
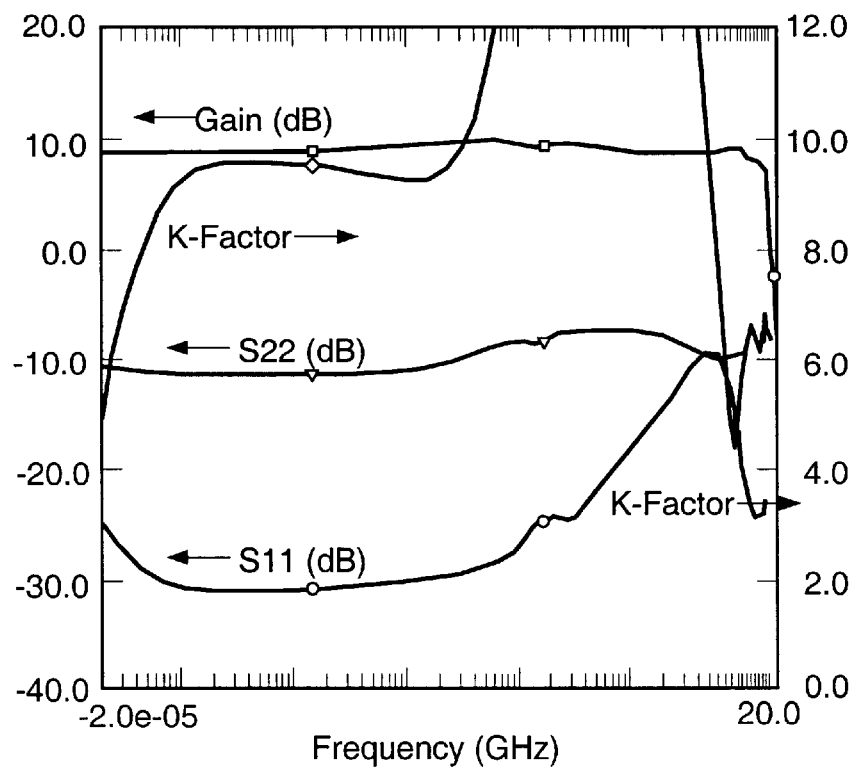
FIG. 9 is a graph with frequency on the horizontal axis that shows the wideband small signal response on a logarithmic scale, and further shows a multi-decade gain and return-loss response from 20 kH to 16 GHz for the amplifier depicted in FIG. 6.

FIG. 9 shows the wide band small signal response on a logrhythmic scale, and illustrates a multi-decade gain and return-loss response from 20 kHz to 16 GHz. This figure also illustrates the stability K- factor.

Figure 10:
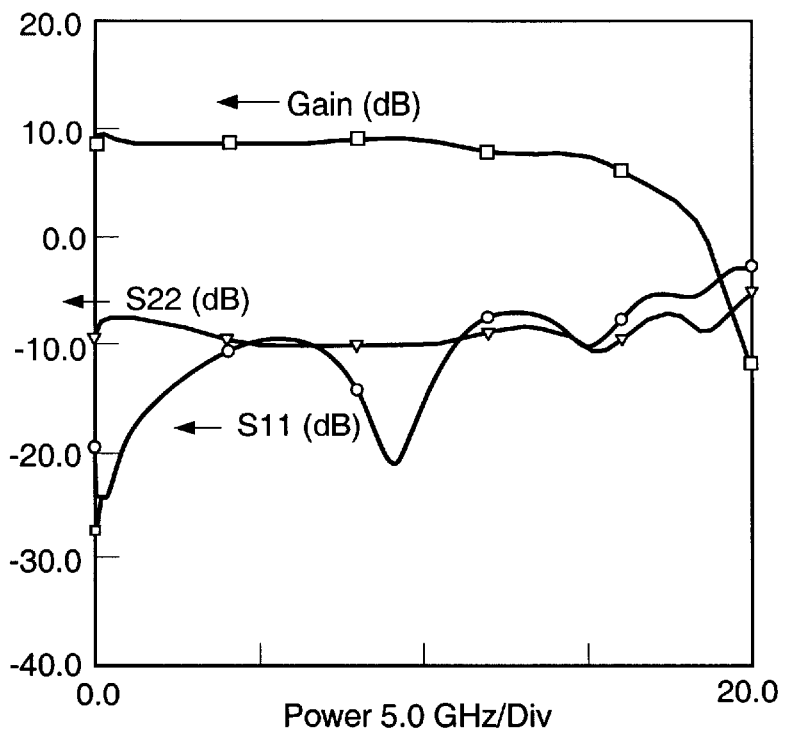
FIG. 10 is a graph with frequency on the horizontal axis that shows the wideband small signal response on a linear scale and illustrates a multi-decade gain and return-loss response from 20 kHz to 16 GHz for the amplifier depicted in FIG. 6.

FIG. 10 shows the wide band small signal response of the amplifier 50 on a linear scale, and illustrates a multi-decade gain and return-loss response from 20 kHz to 16 GHz.

Figure 11:
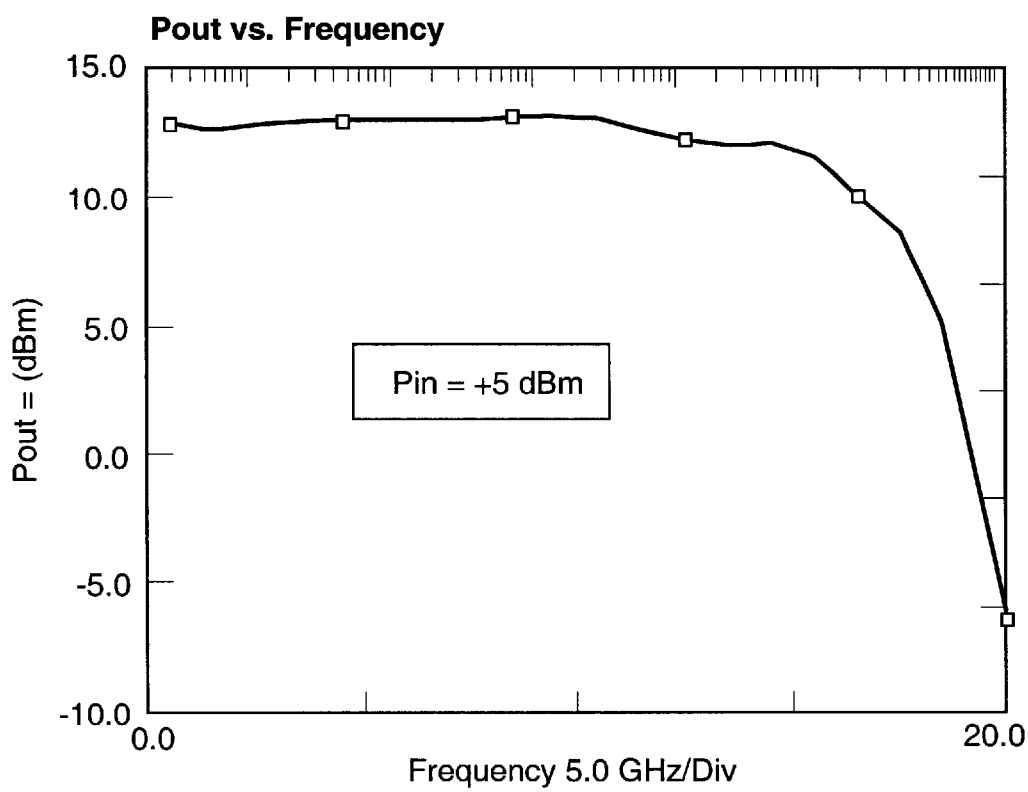
FIG. 11 is graph with frequency on the horizontal axis and power output on the vertical axis that shows the wideband output power response for a fixed input power of +5 dBm for the amplifier depicted in FIG. 6.

FIG. 11 shows the wide band output power response for a fixed input power +5 dBm. The amplifier 50 maintains a flat output power of 12.5 dBm for nearly the entire 20 kHz to 16 GHz bandwidth, illustrating wide bandwidth response under large signal operation.

It is to be understood that the invention is not limited to the exact construction illustrated and described above, but that various changes and modifications may be made without departing from the spirit and scope of the invention as defined in the following claims.

What is claimed is:

1. A capacitively coupled distributed amplifier comprising:
    an input transmission line including a plurality of input inductors, said input transmission line further including an input termination resistor;
    an output transmission line including a plurality of output inductors, said output transmission line further including an output termination resistor;
    a plurality of distributed amplifying devices electrically connected to the input transmission line and the output transmission line;
    a feedback regulator electrically connected to the output termination resistor, said regulator sensing a voltage potential across the output resistor and comparing the voltage potential to a reference potential, said regulator providing an output signal to the amplifying devices indicative of the difference between the sensed voltage potential and the reference potential; and
    a distributed transmission line filter electrically connected between the feedback regulator and the input termination resistor, said transmission line filter filtering RF signals from the output transmission line.

2. The amplifier according to claim 1 wherein the regulator includes a load resistor that sets the reference potential.

3. The amplifier according to claim 1 wherein the regulator includes a voltage divider that DC level shifts the output signal of the regulator.

4. The amplifier according to claim 1 wherein each of the amplifying devices includes an HBT device.

5. A capacitively coupled distributed amplifier comprising:
    an input transmission line including a plurality of input inductors, said input transmission line further including an input termination resistor;
    an output transmission line including a plurality of output inductors, said output transmission line further including an output termination resistor;
    a plurality of distributed amplifying devices electrically connected to the input transmission line and the output transmission line;
    a feedback regulator electrically connected to the output termination resistor, said regulator sensing a voltage potential across the output resistor and comparing the voltage potential to a reference potential, said regulator providing an output signal to the amplifying devices indicative of the difference between the sensed voltage potential and the reference potential, the regulator including an emitter follower transistor driving bias currents of the amplifying devices, a load resistor that sets the reference potential, and a voltage divider that DC level shifts the output signal of the regulator; and a distributed transmission line filter electrically connected between the feedback regulator and the input termination resistor, said transmission line filter filtering RF signals from the output transmission line.

6. A capacitively coupled distributed amplifier comprising:

an input transmission line including a plurality of input inductors, said input transmission line further including an input termination resistor;

an output transmission line including a plurality of output inductors, said output transmission line further including an output termination resistor;

a plurality of distributed amplifying devices electrically connected to the input transmission line and the output transmission line;

a feedback regulator electrically connected to the output termination resistor, said regulator sensing a voltage potential across the output resistor and comparing the voltage potential to a reference potential, said regulator providing an output signal to the amplifying devices indicative of the difference between the sensed voltage potential and the reference potential, the regulator including a plurality of transistors defining a differential amplifier, said differential amplifier mirroring the reference voltage to an end node at the end of the output transmission line; and a distributed transmission line filter electrically connected between the feedback regulator and the input termination resistor, said transmission line filter filtering RF signals from the output transmission line.

7. The amplifier according to claim 6 further including an RF blocking resistor connected between the differential amplifier and the end node.

8. A capacitively coupled distributed amplifier comprising:

an input transmission line including a plurality of input inductors, said input transmission line further including an input termination resistor;

an output transmission line including a plurality of output inductors, said output transmission line further including an output termination resistor;

a plurality of distributed amplifying devices electrically connected to the input transmission line and the output transmission line;

a feedback regulator electrically connected to the output termination resistor, said regulator sensing a voltage potential across the output resistor and comparing the voltage potential to a reference potential, said regulator providing an output signal to the amplifying devices indicative of the difference between the sensed voltage potential and the reference potential, the regulator including a compensation capacitor that filters out high frequency RF signals applied to the regulator from the output transmission line; and a distributed transmission line filter electrically connected between the feedback regulator and the input termination resistor, said transmission line filter filtering RF signals from the output transmission line.

9. A capacitively coupled distributed amplifier comprising:

an input transmission line including a plurality of input inductors, said input transmission line further including an input termination resistor;

an output transmission line including a plurality of output inductors, said output transmission line further including an output termination resistor;

a plurality of distributed amplifying devices electrically connected to the input transmission line and the output transmission line;

a feedback regulator electrically connected to the output termination resistor, said regulator sensing a voltage potential across the output resistor and comparing the voltage potential to a reference potential, said regulator providing an output signal to the amplifying devices indicative of the difference between the sensed voltage potential and the reference potential; and a distributed transmission line filter electrically connected between the feedback regulator and the input termination resistor, said transmission line filter filtering RF signals from the output transmission line, the transmission line filter comprising a plurality of stages, where each stage includes an inductor and a capacitor.

10. The amplifier according to claim 9 wherein each stage of the transmission line filter further includes a resistor to inhibit resonances resulting from an off-chip load connected to the input termination resistor.

11. A distributed amplifier comprising:

an input transmission line including an input end and a termination end, said input transmission line including an input termination resistor at the termination end of the input transmission line;

an output transmission line including a termination end and an output end, said output transmission line further including an output termination resistor at the termination end of the output transmission line;

a plurality of amplifying devices capacitively coupled to and distributed along the input transmission line and the output transmission line; and a feedback loop connected between the termination end of the input transmission line and the termination end of the output transmission line, said feedback loop controlling the output gain of the amplifying devices.

12. The amplifier according to claim 11 wherein each of the amplifying devices includes a bipolar transistor.

13. A distributed amplifier comprising:

an input transmission line including an input end and a termination end, said input transmission line including an input termination resistor at the termination end of the input transmission line;

an output transmission line including a termination end and an output end, said output transmission line further including an output termination resistor at the termination end of the output transmission line;

a plurality of amplifying devices capacitively coupled to and distributed along the input transmission line and the output transmission line; and a feedback loop connected between the termination end of the input transmission line and the termination end of the output transmission line, said feedback loop controlling the output gain of the amplifying devices, the feedback loop including a feedback regulator electrically connected to the output termination resistor, said regulator sensing a voltage potential across the output termination resistor and comparing the voltage potential to a reference potential, said regulator providing an output signal to the amplifying devices indicative off the difference between the sensed voltage potential and the reference potential.

14. The amplifier according to claim 13 wherein the regulator includes an emitter follower transistor, said follower transistor driving bias currents of the amplifying devices.

15. The amplifier according to claim 13 wherein the regulator includes a load resistor that sets the reference potential.

16. The amplifier according to claim 13 wherein the regulator includes a voltage divider that DC level shifts the output signal of the regulator.

17. The amplifier according to claim 13 wherein the amplifier includes a plurality of transistors defining a differential amplifier, said differential amplifier mirroring the reference voltage to an end node at the termination end of the output transmission line.

18. The amplifier according to claim 17 further including an RF blocking resistor connected between the differential amplifier and the end node.

19. The amplifier according to claim 13 wherein the regulator includes a compensation capacitor that filters out high frequency RF signals applied to the regulator from the output transmission line.

20. A distributed amplifier comprising:
   an input transmission line including an input end and a termination end, said input transmission line including an input termination resistor at the termination end of the input transmission line;
   an output transmission line including a termination end and an output end, said output transmission line further including an output termination resistor at the termination end of the output transmission line;
   a plurality of amplifying devices capacitively coupled to and distributed along the input transmission line and the output transmission line; and
   a feedback loop connected between the termination end of the input transmission line and the termination end of the output transmission line, said feedback loop controlling the output gain of the amplifying devices, the feedback loop including a feedback regulator electrically connected to the output termination resistor and a distributed transmission line filter electrically connected between the input termination resistor and the regulator, said transmission line filter filtering an RF signal from the output transmission line, said regulator sensing a voltage potential across the output termination resistor and comparing the voltage potential to a reference potential, said regulator providing an output signal to the amplifying devices indicative off the difference between the sensed voltage potential and the reference potential.

21. The amplifier according to claim 20 wherein the transmission line filter includes a plurality of stages, where each stage includes an inductor, a resistor and a capacitor.

22. A capacitively coupled distributed amplifier comprising:
   an input transmission line including a plurality of input inductors, said input transmission line further including an input termination resistor;
   an output transmission line including a plurality of output inductors, said output transmission line further including an output termination resistor;
   a plurality of amplifying devices electrically connected to and distributed along the input transmission line and the output transmission line, each amplifying device including an HBT;
   said amplifying devices capacitively coupled to the input transmission line;
   a feedback regulator electrically connected to the output termination resistor and said input termination resistor, said regulator sensing a voltage potential across the output termination resistor and comparing the voltage potential to a reference potential, said regulation providing an output signal to the input termination resistor to control the output of the HBT in each amplifying device, said regulator including a load resistor setting the reference potential, a differential amplifier comparing the reference voltage to the sensed potential, an RF blocking resistor connected between the differential amplifier and the output termination resistor, and a compensation capacitor that filters out high frequency RF signals applied to the regulator from the output transmission line; and
   a distributed transmission line filter electrically connected between the feedback regulator and the input termination resistor, said transmission line filter including a plurality of filter stages, where each stage includes an inductor, a capacitor and a resistor, said transmission line filter filtering RF signals from the output transmission line.

* * * * *